March 17, 1964 J. L. ROGERS 3,125,688

SUPERCONDUCTIVE DEVICE UTILIZING A FERROMAGNETIC SUPERCONDUCTIVE ELEMENT

Filed Jan. 11, 1960 3 Sheets-Sheet 1

JOHN L. ROGERS
*INVENTOR.*

BY Jerry A. Dinardo
AGENT
Albert Rosen
ATTORNEY

JOHN L. ROGERS

*INVENTOR.*

*BY* Jerry A. Dinardo

AGENT

Albert Rosen

ATTORNEY

JOHN L. ROGERS
*INVENTOR.*

BY Jerry A. Dinardo
AGENT
Albert Rosen
ATTORNEY 3,125,688
Patented Mar. 17, 1964

3,125,688

SUPERCONDUCTIVE DEVICE UTILIZING A FERROMAGNETIC SUPERCONDUCTIVE ELEMENT

John L. Rogers, Hermosa Beach, Calif., assignor to Space Technology Laboratories, Inc., Los Angeles, Calif., a corporation of Delaware Filed Jan. 11, 1960, Ser. No. 1,458
15 Claims. (Cl. 307—88.5)

This invention relates to superconductive control arrangements, and more particularly to improvements directed towards increasing the gain of superconductive gating devices.

In the investigation of the electrical properties of materials at very low temperatures it has been found that the electrical resistance of many materials drops abruptly as the temperature is lowered to that close to absolute zero (zero degrees Kelvin)—the material in such a state being termed superconductive. That the electrical resistance of a material in a superconductive state is actually zero, or so close to it as to be undetectable by measurement, has been well illustrated by experiments at the Massachusetts Institute of Technology where a relatively large current, induced in a lead ring in a superconductive state, continued to flow without any detectable decay for a period of over two years. It is also known that a transition from a superconductive to a resistive state can be induced in a superconductor by applying a magnetic field to the superconductor. The magnetic field can be applied externally of the superconductor, or it can be induced internally by the flow of electric current through the superconductor. The flow of an amount of electric current sufficient to effect a transition in a superconductive state is referred to as the "critical current." One form of superconductive gating device, for example, comprises two superconductive elements, or superconductors, arranged in close proximity to each other. A current applied to one of the superconductors, the control element, generates a magnetic field which switches the second superconductor, the controlled or gate element, from the superconductive to a resistive state. The gain or figure of merit of such a gating device may be defined as the ratio of the required switching (control) current to the gate (controlled) current. In other words, the gain is the ratio of the critical current required in the gate element only, to effect a change in state in the gate element, as compared to the critical current required in the control element only, to effect the same change in state in the gate element. The gain of the gating device may also be considered to be proportional to the ratio of the respective magnetic field of the current flow in the gate and control circuits.

While superconductive gating circuits have shown great promise in the computer and related fields due to their inherent high speed of operation and small size, problems have arisen in the effective utilization of such arrangements as the speed and size are decreased to, respectively, speeds of less than 10 millimicroseconds and sizes involving thickness dimensions of the order of a small fraction of a micron. Furthermore, it has been found that speed and size are related such that switching speeds of the order of 10 millimicroseconds and less are realizable only when superconductive elements are made in the form of thin films of the order of less than .1 micron. However, it also appears that the gating circuit gain (the ratio of the control and controlled currents) is appreciably reduced as the thickness dimension of its superconductive elements is reduced. Consequently, extremely high speeds have heretofore been incompatible with high gain.

Accordingly, one of the more important objects of this invention is to provide a superconductive arrangement for realizing high switching speed while preserving gain.

A further object of the invention is to provide a thin film superconductive gating device characterized by its compactness, high gain, and high speed of response.

The foregoing and other objects are achieved in accordance with this invention in a current control arrangement in the form of a gating device comprising superconductive gate and control elements. The gate element takes the form of a thin film of a material that exhibits ferromagnetic properties at a temperature at which it exhibits superconductive properties. Such a material has a substantially higher magnetic permeability ($\mu$) than a material exhibiting superconductive properties only. The increased permeability results in substantially increasing the ratio of the magnetic fields required to switch the gate element from the superconductive to resistive state, and the gain of the gating device is correspondingly increased.

According to another feature of the invention, a memory unit is provided which utilizes the remanent magnetization of a ferromagnetic gate element resulting from a current pulse applied to the control element to provide a storage of information. The storage of information is changed by reversing the magnetization of the gate element, as by applying a control current pulse in a direction opposite that of the pulse previously applied. The superconductive properties of the gate element are utilized to provide a means of detecting the stored information.

The term "magnetic permeability," as referred to in this specification, is used in the conventional magnetic sense and is defined as the ratio of the internal flux density (B) to the net internal field (H) (the latter field being the resultant or total of the applied field, the field caused by eddy currents, and the field caused by demagnetizing effects). This definition is included to avoid confusion with the meaning frequently given to the term permeability when dealing with superconductors where the eddy currents are ignored in the computation of the internal field (H). On the latter convention, the permeability of a long thin specimen of a nonferromagnetic superconductive material oriented axially in a magnetic field is substantially zero, whereas, with the definition used here, the permeability of a non-ferromagnetic superconductor of any shape is substantially that of free space.

In the drawings, wherein like reference characters refer to like parts:

Figure 4:
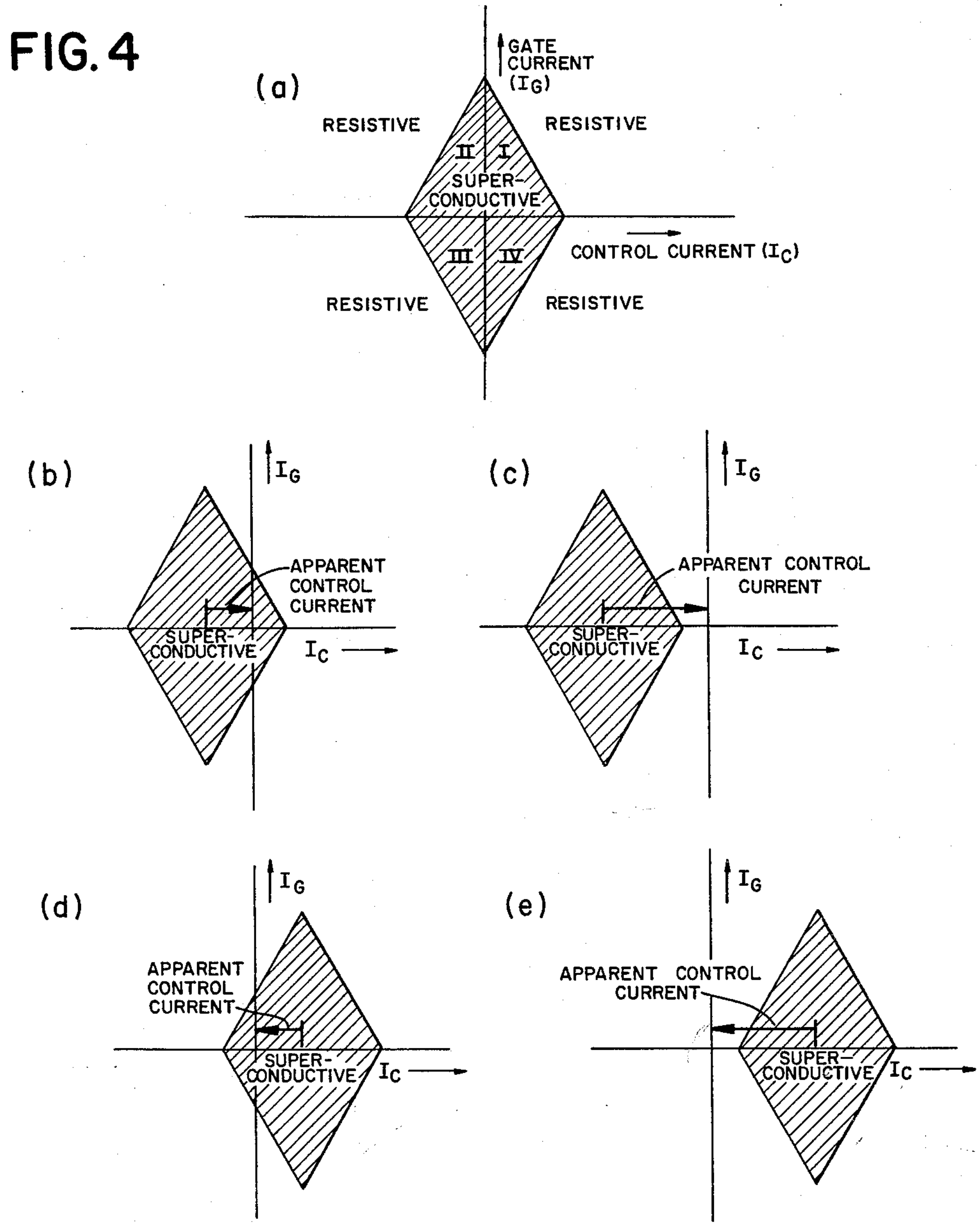
Figure 6:
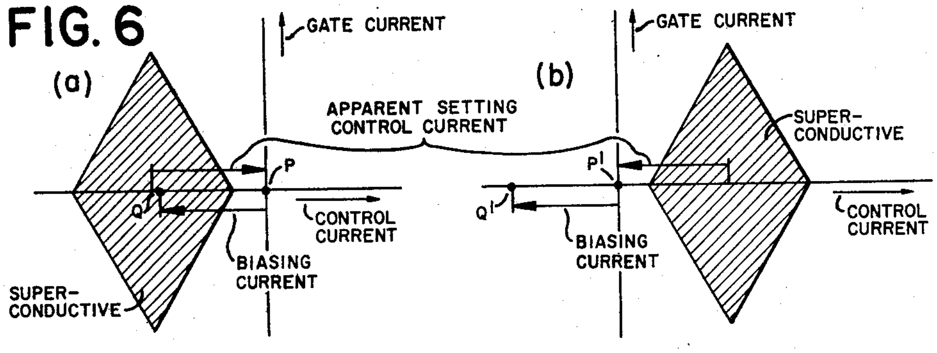
Figure 7:
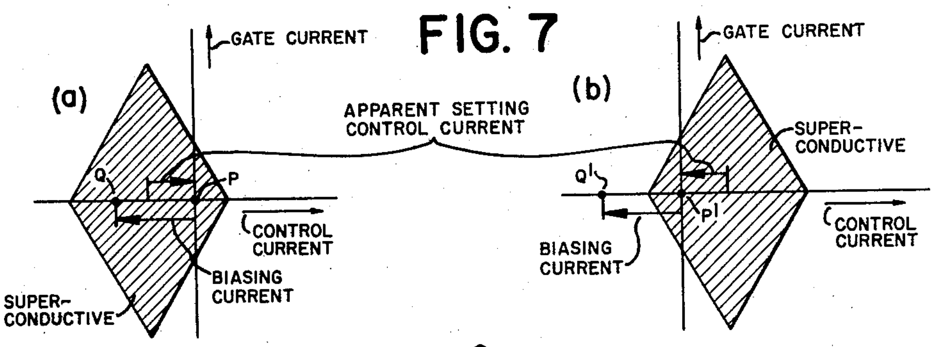
Figure 5:
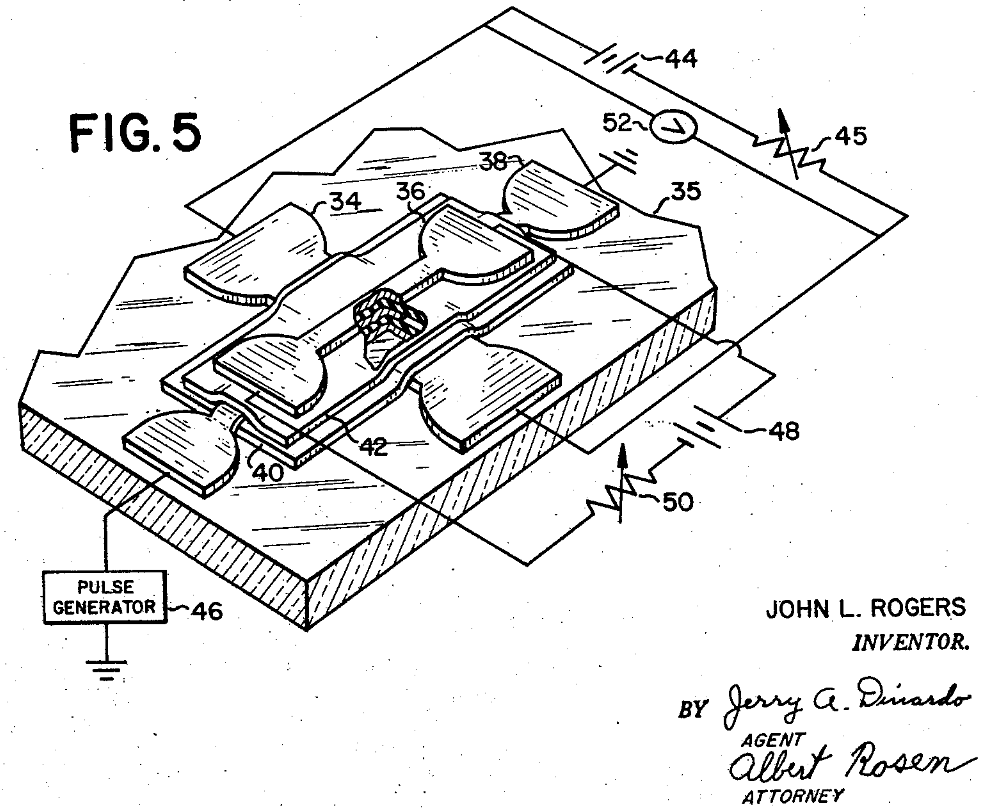

FIGS. 4(*a*) through 4(*e*) are a series of graphs illustrating the relative values of control current and gate current required to transform a gate element from the superconductive to the resistive state under different conditions of remanent magnetization;

FIG. 5 is a partly diagrammatic, partly schematic view of a memory unit incorporating a ferromagnetic superconductive gate element according to the invention; and FIGS. 6(*a*) and 6(*b*), and FIGS. 7(*a*) and 7(*b*) are graphs similar to those of FIG. 4, illustrating in greater detail the operation of the memory unit of FIG. 5.

Since the arrangement of the invention is predicated upon certain effects peculiar to the phenomena of superconductivity, these effects will be discussed prior to a discussion of embodiments of the invention.

*Superconductive Phenomena*

At temperatures near absolute zero some materials apparently lose all resistance to the flow of electrical current and become what appear to be perfect conductors of electricity. This phenomenon is termed superconductivity and the temperature at which the change occurs, from a normally resistive state to the superconductive state, is called the transition temperature. For example, the following materials have transition temperatures and become superconductive, as noted:

| | ° Kelvin |
|---|---|
| Niobium | 8 |
| Lead | 7.2 |
| Vanadium | 5.1 |
| Tantalum | 4.4 |
| Mercury | 4.1 |
| Tin | 3.7 |
| Indium | 3.4 |
| Thallium | 2.4 |
| Aluminum | 1.2 |

Only a few of the materials exhibiting the phenomenon of superconductivity are listed above. Other elements, and many alloys and compounds, become superconductive at temperatures ranging between 0° and around 20° Kelvin. A discussion of many such materials may be found in a book entitled "Superconductivity" by D. Schoenberg, Cambridge University Press, Cambridge, England, 1952.

The above-listed transition temperatures apply only where the materials are in a substantially zero magnetic field. In the presence of a magnetic field the transition temperature is decreased. Consequently, in the presence of a magnetic field a given material may be in an electrically resistive state at a temperature below the absence-of-magnetic-field or normal transition temperature. A discussion of this aspect of the phenomenon of superconductivity may be found in U.S. Patent 2,832,897, entitled "Magnetically Controlled Gating Element," granted to Dudley A. Buck.

In addition, the above-listed transition temperatures apply only in the absence of electrical current flow through the material. When a current flows through a material, the transition temperature of the material is decreased. In such a case the material may be in an electrically resistive state even though the temperature of the material is lower than the normal transition temperature. The action of a current in lowering the temperature at which the transition occurs (from a state of normal electrical resistivity to one of superconductivity) is similar to the lowering of the transition temperature by an external magnetic field, inasmuch as the flow of current itself induces a magnetic field.

Accordingly, when a material is held at a temperature below its normal transition temperature for a zero magnetic field, and is thus in a superconductive state, the superconductive condition of the material may be extinguished by the application of an external magnetic field or by passing an electric current through the material.

Figures 1, 2, 3:
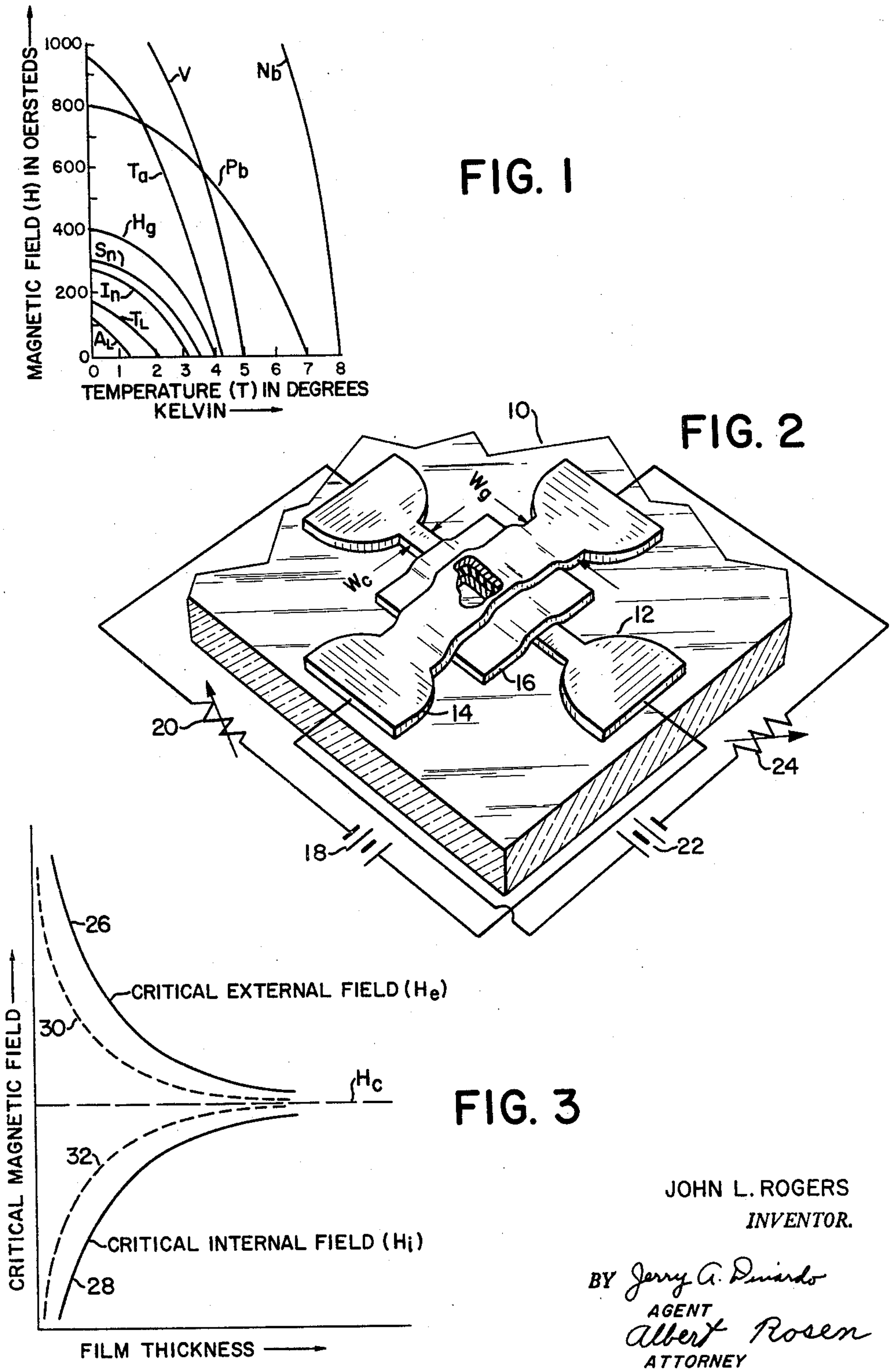
FIG. 1 is a graph illustrating the variation in transition temperatures for various materials as a function of the magnetic field to which they are subjected.
FIG. 2 is a partly diagrammatic, partly schematic view of a gating device incorporating a ferromagnetic superconductive gate element according to the invention.
FIG. 3 is a graph illustrating the variations in critical internal and external magnetic fields associated with a thin superconductive film as a function of the film thickness.

FIG. 1 illustrates the variation in transition temperatures (T) for several materials as a function of an applied magnetic field. In the absence of a magnetic field, the point at which each of the several curves intercepts the abscissa is the transition temperature at which the material becomes superconductive. (The transition temperature for each material varies almost parabolically with the magnetic field applied to it, as expressed by the function $$\frac{H_c}{H_o}=1-\left(\frac{T}{T_c}\right)^2$$

where $H_c$ is the critical magnetic field density for effecting a transition from the superconductive to the resistive state at any given temperature T, $H_o$ is the intercept of a curve on the ordinate axis, at zero degrees Kelvin, and $T_c$ is the transition temperature of the material in the absence of a magnetic field.) The transition temperature is given in degrees Kelvin. A particular material is superconductive for values of temperature and magnetic field falling beneath each of the several curves, while for values of temperature and magnetic field falling above a curve, the material possesses electrical resistance.

Since a current flowing in the material has an effect upon the transition temperature that is similar to the effect of a magnetic field, the passage of a current through superconductive materials will yield curves similar to those shown in FIG. 1.

*Superconductive Gating Device*

FIG. 2 shows one form of gating device constructed in accordance with the invention. Such a gating device and combinations thereof may be used to perform many of the well known logical functions in the computer art. For example, it may be used in the various ways described in the aforementioned Buck Patent 2,832,897.

The gating device comprises an insulating substrate 10, such as a sheet of glass, supporting an elongated, thin film superconductive switching or control element 12. Adjacent to the control element 12 and extending in a direction transverse of the element 12 is mounted an elongated, thin film superconductive gate element 14, with the two elements 12 and 14 being separated and insulated from each other by a film 16 of insulating material, such as silicon monoxide. The control element 12 is made of a material having a much higher transition temperature than the material of the gate element 14. Suitable materials for the control element 12 are lead or niobium, for example. The wide difference in the transition temperatures of the two elements 12 and 14 is to assure that the control element 12 will remain superconducting during the operation of the gating device. In addition, the width of the control element 12 is preferably substantially smaller than the width of the gate element 14. The control element 12 is connected to a voltage source 18 in series with a variable resistor 20 which can be controlled to pass a desired level of current through the control element 12. Similarly, the gate element 14 is connected in series with a voltage source 22 through a variable resistor 24.

In accordance with the invention the gate element 14 is made of a material that is both ferromagnetic and superconductive at a given temperature of operation. A preferred material for the gate element 14 is an eight atomic percent solid solution of gadolinium ruthenium in cerium ruthenium ($Gd_{0.08}Ce_{0.92}Ru_2$). Such a material has been found to be both superconducting and ferromagnetic at a temperature of about 1.3° K. However, other proportions of the solute and solvent may be used within a range of temperatures. A 6% solution may be used at a temperature of 3.6° K. and below, and the 8% solution may be used at a temperature of 3.1° K. and below. Another example of a ferromagnetic superconductive material that may be used is a solid solution containing small percentages of $GdOs_2$ in $YOs_2$ (gadolinium osmium in yttrium osmium). For example, a 7 atomic percent solid solution may be used at a temperature less than 2.6° K., and a 9 atomic percent solid solution may be used at a temperature less than 1.4° K. It has also been found that a solution of 1 atomic percent gadolinium in lanthanum has ferromagnetic and superconductive properties at a temperature of about .5° K.

In operation, the gating device is maintained at a temperature just below the critical temperature of the gate element 14 and well below the critical temperature of the control element 12. In the absence of current flow through the control element 12, there will be no magnetic field present to act on the gate element 14, and the gate element 14 will have a definite critical current level for causing it to transform or switch from the superconductive to the resistive state. Thus it would take a relatively high current flowing through the gate element 14, from the gate current source 22, to cause the gate element 14 to switch. However, when a current is caused to flow through the control element 12 from the control current source 20, a magnetic field is created around the control element 12, imparting a magnetic bias on the gate element 14. Assuming that the bias is insufficient in itself to cause the gate element 14 to switch, it nevertheless acts to reduce the critical current requirement of the gate element 14. Thus, less current is now needed to be supplied by the gate current source 22 to cause the gate element 14 to switch than was needed in the absence of the magnetic bias. The higher the control current, and thus the higher the magnetic bias, the lower the gate current required to effect a switching of the gate element 14. Consequently, by varying the control current, and thus the magnetic bias, the critical current requirement of the gate element 14 can be varied, even to the point where the gate element can be switched by the application of control current alone. From the foregoing it is seen that when the gating device is operated under the sole control of the control element 12, current will flow through the gate element when the latter is superconductive, and will not flow when the gate element is resistive, depending on whether the control current is cut off or is flowing respectively.

The gain of a gate or gating device is a measure of the amount of gate current that can be controlled by the control current. The gain, as indicated above, is the ratio of the critical current required in the gate element only, to effect a change in state in the gate element, as compared to the critical current required in the control element only, to effect the same change in state in the gate element. Thus it is desirable to increase the gain as a means of controlling a large gate current with a small amount of control current.

The gain of the gating device of FIG. 2 can be expressed by the following formula:

$$\text{Gain}=\frac{w_g}{w_c}\cdot\frac{H_i}{H_e}$$

where $w_g$ is the width of the gate element 14; $w_c$ is the width of the control element 12; and $H_i/H_e$ is the ratio of the critical internal magnetic field $H_i$ (the magnetic field associated with the critical current of the gate element in the absence of any control element current) and the critical external magnetic field $H_e$ (the magnetic field associated with the critical current of the control element in the absence of any gate element current). It is generally desirable to make a superconductive element, such as the gate element 14, as thin as possible to take advantage of the increased switching speed of very thin films. However, as will be seen from the following explanation in connection with the graph of FIG. 3, the ratio of the critical internal magnetic field, $H_i$, to the critical external magnetic field, $H_e$, decreases with decreasing film thickness; thus the gain, which is a function of this ratio, decreases accordingly.

The graph of FIG. 3 shows the variation in critical magnetic fields due to internal currents and external currents ($H_i$ and $H_e$, respectively) as a function of thickness, of a thin film superconductive element. Film thickness is plotted along the abscissa and critical magnetic field is plotted along the ordinate. As shown in curve 26, when a magnetic field is applied to a thin film superconductive element from an external source the critical magnetic field, $H_e$, is very high for the thinnest films and reduces with increasing thickness, the field asymptotically approaching a value $H_c$ for the thickest films. On the other hand, when the magnetic field is internally generated by a current flowing through the element, the critical magnetic field, $H_i$, represented by curve 28, is very low for the thinnest films and increases with increasing thickness, with the field asymptotically approaching the same value $H_c$ for the thickest films. Thus for very thick films, say of the order of 10 microns, the ratio of the critical internal field $H_i$ to the critical external field $H_e$ is very close to unity, but for very thin films, say of the order of .1 micron or less, the ratio is very much smaller than unity. Accordingly, if the film thickness of the gate element 14 is reduced in order to increase the switching speed, the critical field ratio $H_i/H_e$ and thus the gain is substantially reduced.

Although the gain can be increased by adjusting the width dimensions of the gate and control elements 14 and 12, respectively, so as to maximize the ratio $w_g/w_c$, such an expedient results in a lowering of the controllable resistance (the resistance of the gate element 14 in the resistive state); and the resulting lowered resistance proves undesirable in many applications. Furthermore, there are practical fabrication limitations on the size of the control element. By the employment of a ferromagnetic superconductor as the gate element 14, in accordance with the invention, the critical field ratio $H_i/H_e$ can be substantially increased so as to increase the gain for a gating device made of thin films. As will be seen from the following consideration of the properties of thin film superconductors, the increase in gain is brought about by an increase in the magnetic permeability ($\mu$) of the gate element 14 material, the material of the gate element 14 having a higher magnetic permeability ($\mu$) than the more common superconductive materials in which the ferromagnetic properties are absent.

The penetration depth of a superconductor is a measure of the depth to which a magnetic field extends into the superconductor. It is a fixed value for a given material at a given temperature. Thus thin films are penetrated to a greater extent, in proportion to their total film thickness, than thick films. It is a property of superconductors that the penetration depth is proportional to the reciprocal of the square root of the permeability; in other words, the penetration depth varies as $$\frac{1}{\sqrt{\mu}}$$

Thus, by increasing the permeability of the gate element material, the extent of penetration of the field is reduced and the effective thickness of the film is increased, though its physical thickness remains at the same low value. If the solid line curves 26 and 28 of FIG. 3 represent the critical fields $H_i$ and $H_e$, respectively, of a conventional non-ferromagnetic superconductive material, the effect of increasing the permeability and decreasing the penetration depth is to shift the critical field curves 26 and 28 to the left, as shown by the dashed line curves 30 and 32; these dashed line curves represent the critical fields of the ferromagnetic superconductive material of the invention. As seen in the graph of FIG. 3, the critical magnetic field ratio and thus the gain of a gating device utilizing a very thin ferromagnetic superconductive material for the gate element 14 will be the same as those of a conventional gating device having a thicker gate element.

Another important feature of the invention resides in the fact that the remanent magnetization existing in the gate element 14 by virtue of its ferromagnetic properties can be utilized to sustain it in the resistive state even after removal of the control current. For an understanding of this phenomenon, first consider the gate element to be in an unmagnetized condition. The gating device has substantially the operating characteristics shown in the graph of FIG. 4(*a*). This graph shows the relative values of the control current $I_c$, plotted along the abscissa, and the gate current $I_g$, plotted along the ordinate, required to transform the gate element from the superconductive to resistive state. For values of gate and control currents within the shaded area the gate element is superconductive, and for values of gate and control currents outside the shaded area, the gate element is resistive. Operation in the first quadrant (I) is for the condition where the gate current $I_g$ and the control current $I_c$ are each assumed to have a given direction of current flow; for example, the directions may be designated positive for the current flows depicted in FIG. 4(*a*). In the second quadrant (II), the gate current is in the same direction as that in the first quadrant, i.e., positive, but the control current is in a direction opposite its direction in the first quadrant, i.e., negative. In the third quadrant (III), both the gate and control currents are negative. Finally in the fourth quadrant (IV), the gate current is negative and the control current is positive.

The flow of control current can not magnetize the gate element 14 while the latter is in the superconductive state. However, once the gate element 14 is switched to the resistive state, and the magnetic field due to the flow of control current exceeds the coercive force of the gate element, the current will magnetize the gate element. When the control current is removed, the magnetized gate element 14 will behave as though a control current of the same sign were still applied, the magnitude of the apparent control current (or magnetic bias) depending upon the magnitude of the remanent magnetization. The magnetic bias due to the remanent magnetization will cause a displacement of the characteristic curves along the control current axis, the condition shown in FIG. 4(*b*) obtaining if the remanent magnetization is less than the critical magnetic field associated with the gate element 14 and the condition shown in FIG. 4(*c*) obtaining if the remanent flux density is greater than the critical magnetic field of the gate element 14. In each of FIGS. 4(*b*) and 4(*c*) it is assumed that the direction of the control current is positive, as the term is used in connection with FIG. 4(*a*).

If the magnetization is reversed, as by applying control current in the opposite (or negative) direction, and of a magnitude sufficient to cause the gate element 14 to switch and to reverse the direction of the magnetization, the operating curves 4(*b*) and 4(*c*) will be displaced to the right as shown in FIGS. 4(*d*) and 4(*e*), respectively.

In accordance with the foregoing principles, a bistable or non-destructive memory unit, constructed from a single gating device employing a ferromagnetic superconductive gate element, can be made to perform substantially the same logical functions that would require six gating devices not employing a ferromagnetic gate element. One such novel memory unit of the invention, and associated circuitry, is shown in FIG. 5. A single ferromagnetic gate element 34, deposited on a substrate 35, is crossed by a pair of nonferromagnetic control elements, namely a bias control element 36 and a setting control element 38. As in the gating device previously described in connection with FIG. 3, both the bias control element 36 and the setting control element 38 are formed from a superconductive material having a higher transition temperature than the material of the gate element 34 so that the control elements 36 and 38 will remain superconductive at the operating temperature. The control elements 36 and 38 may be mounted on the same side of the gate element 34, as shown, or they may be mounted on opposite sides. In either case, all three elements 34, 36, and 38 are mutually insulated, as by intermediate insulating films 40 and 42.

The bias control element 36 is connected in series with a voltage source 48 and a variable resistor 50, which is adjustable to apply a desired amount of current to the bias control element 36 and to thus apply a magnetic biasing field to the gate element 34. The setting control element 38 is connected to a pulse generator 46 from which current pulses of either positive or negative polarity supplied to the setting control element 38 serve to apply magnetizing fields to the gate element 34. The gate element 34 is connected to a sensing circuit including a voltage source 44 in series with a variable resistor 45, and a sensing device 52, such as a voltmeter, connected across the gate element 34; the latter serves to sense the voltage across the gate element 34 to thereby sense the state of the gate element 34. When the gate element 34 is superconductive the sensed voltage is zero, but when the gate element 34 is resistive, a voltage is produced across the gate element 34.

In the operation of the bistable device of FIG. 5, a magnetizing current pulse of either polarity is first supplied by the pulse generator 46 to the setting control element 38. For purposes of explanation, assume that the pulse is positive and of sufficient magnitude to switch the gate element 34 from the superconductive to the resistive state and to magnetize the gate element 34. Further, assume that the remanent magnetization is sufficient to keep the gate element 34 resistive after the pulse is removed. Such are the conditions corresponding to FIG. 6(*a*) at the operating point P. If a pulse of the same polarity (i.e., in the same direction as that of the apparent control current) is applied to the setting control element 38 substantially no permanent change will occur in the state of the gate element 34 since the gate element is already magnetized to remanence in that direction. Now, if a pulse of opposite polarity is applied, which is of sufficient magnitude to overcome the remanent magnetization and also to reverse the direction of magnetization, the gate element 34 may change its state only instantaneously but will quickly become resistive again, its state now being exemplified by the point P′ of FIG. 6(*b*). Obviously, a change in direction of the applied pulses has not been sensed, as by a change in the state of the gate element, and thus the device as above described is not capable of acting as a bistable memory unit. To provide the device with the bistable and memory characteristics, the current in the bias control element 36 is adjusted to apply to the gate element 34 a magnetic biasing field that opposes and substantially cancels the effect of the remanent magnetization when the magnetization is in one direction, but reinforces the effect of the remanent magnetization when the mangetization is in the opposite direction. Referring to FIG. 6(*a*), the bias control current is of sufficient magnitude to transform the gate element 34 to the superconductive state, as exemplified by the operating point Q. If a pulse is applied to the setting control element 38 which induces a magnetic field in the gate element 34 in the same direction as that of the remanent magnetization, the gate element 34 will remain superconductive since the direction of the remanent magnetization remains unchanged. In other words, the gate element will remain in the state exemplified by the point Q in FIG. 6(*a*). However, a magnetizing pulse can now be applied in the reverse direction, at an amplitude sufficient to cause the gate element 34 to become resisitve, and further, to reverse the magnetization in the gate element 34. Now the state of the device is that represented by the point Q′ in FIG. 6(*b*), wherein the field produced by the biasing current and the remanent magnetization are in the same direction.

It is now apparent that the memory unit has two stable states; one in which the remanent magnetization in the gate element 34 is in one direction, and one in which the remanent magnetization is in the opposite direction. A setting pulse that produces a magnetizing field in the same direction as that of the remanent magnetization will produce no change in the state of the gate element 34, whereas an oppositely directed setting pulse will produce a change in state of the gate element 34 and a reversal of its remanent magnetization.

A similar operation will result if the remanent magnetization is not sufficient to keep the gate element in the resistive state. FIG. 7(*a*) illustrates the conditions prevailing when the gate element 34 is in the superconductive state (point Q) and FIG. 7(b) illustrates the conditions prevailing when the gate element 34 is in the resistive state (point Q′). In both of these cases it may be necessary to apply a biasing field which is greater than the remanent magnetization so that oppositely directed setting pulses will produce a change in the state of the gate element 34.

For proper operation of the memory unit, it is important to ensure that the bias control current and the setting current pulses are of the proper magnitude. The bias control current may be less than or greater than an amount sufficient to cancel the remanent magnetization, when the gate element is in the superconductive state. The bias control current must, however, be in a range of values which will permit the memory unit to change its state upon reversal of the magnetization. The magnitude of the setting current must be at least as great as twice the magnitude of the critical control current, and at least great enough to provide the coercive force of the ferromagnetic gate element (the coercive force being the field necessary to magnetize the gate element or to change its magnetization).

While the memory unit has been described as employing two control elements 36 and 38, it may also be constructed with a single control element to which both biasing and setting currents are applied. Alternatively, three control elements may be used, one for the biasing current, a second one for setting pulses of one polarity, and the third one for setting pulses of the opposite polarity. Since the physical arrangements of such modifications are apparent from the illustrations and discussion in connection with FIGS. 3 and 5, they are not further depicted or discussed here.

What is claimed is:

1. A superconductive gating device comprising two superconductive elements mounted adjacent to each other and having different critical transition temperature and magnetic field characteristics, the element having the lower transition temperature characteristic being formed from a single homogeneous body of material that is both superconductive and ferromagnetic at its superconductive operating temperature, and means for causing current to flow through the other element to develop a magnetic field for changing the state of said ferromagnetic superconductive element from a superconducting unmagnetized condition to a resistive magnetized condition.

2. A superconductive gating device according to claim 1, wherein said ferromagnetic superconductive material comprises a solid solution of from six to eight atomic percent gadolinium ruthenium and the balance cerium ruthenium.

3. A superconductive gating device according to claim 1, wherein said ferromagnetic superconductive material comprises a solid solution of from seven to nine atomic percent of gadolinium osmium and the balance yttrium osmium.

4. A superconductive gating device comprising a first thin film superconductive element adapted to receive a flow of electric current therethrough, means for causing current flow through said first element to produce a magnetic field, and a second thin film superconductive element positioned within the influence of the magnetic field produced by said current flow, said elements having different critical transition temperature and magnetic field operating characteristics, the element having the lower critical magnetic field at a given temperature of operation being formed of a single homogeneous body of material that has a higher magnetic permeability at its superconductive operating temperature than the material of the other element.

5. A superconductive gating device comprising a thin film gate element having a given width dimension, said gate element being formed from a single homogeneous body of material having both superconductive and ferromagnetic properties at its superconductive operating temperature, and adjacent means for creating a magnetic field to change the state of said gate element from a superconducting unmagnetized condition to a resistive magnetized condition, said magnetic field means including a superconductive nonferromagnetic control element mounted in close proximity to said gate element and having a width dimension smaller than said given width dimension.

6. A superconductive gating device comprising an elongated thin film gate element formed from a single homogeneous body of material that is both superconductive and ferromagnetic at its superconductive operating temperature, and adjacent means for creating a magnetic field to change the state of said gate element from a superconducting unmagnetized condition to a resistive magnetized condition, said magnetic field means including an elongated superconductive nonferromagnetic control element mounted in close proximity to and transversely across said gate element.

7. A superconductive gating device comprising an insulating substrate, a first elongated thin film element of a first superconductive material mounted on said substrate, an insulating film mounted on said superconductive element, and a second elongated thin film element of a second superconductive material mounted on said insulating film in a position extending across said first superconductive element, one of said superconductive elements being formed of a single homogeneous body of material that is both superconductive and ferromagnetic at its superconductive operating temperature, and means for applying current to the other superconductive element to develop a magnetic field for converting the state of said one element from a superconducting unmagnetized condition to a resistive magnetized condition.

8. A superconductive gate comprising a thin film nonferromagnetic superconductive element and a thin film ferromagnetic superconductive element positioned adjacent to said nonferromagnetic element, said ferromagnetic superconductive element being formed of a single homogeneous body of material that is both ferromagnetic and superconductive at its superconductive operating temperature, and means for applying current to said nonferromagnetic superconductive element to develop a magnetic field for transforming the state of said ferromagnetic superconductive element from a superconducting unmagnetized condition to a resistive magnetized condition.

9. A superconductive storage device comprising a ferromagnetic superconductive element having a predetermined critical magnetic field level for superconductive to resistive transformation and having a predetermined coercive force, means connected to apply to said element a magnetic field in excess of both said critical magnetic field and said coercive force, thereby to cause said element to transform from a superconductive to resistive state and to become magnetized in a given direction, whereby, upon removal of said magnetic field, a remanent magnetization will be stored in said element in said given direction.

10. A superconductive storage device comprising a ferromagnetic superconductive element having a predetermined critical magnetic field level for superconductive to resistive transformation and having a predetermined coercive force; means connected to apply to said element a magnetic field in excess of both said critical magnetic field and said coercive force, thereby to cause said element to transform from a superconductive to resistive state and to become magnetized in a given direction; whereby, upon removal of said magnetic field, a remanent magnetization will be stored in said element in said given direction; and means connected to apply to said element a magnetic field in opposition to said remanent magnetization.

11. A superconductive storage device comprising a ferromagnetic superconductive element having a predetermined critical magnetic field level for superconductive to resistive transformation and having a predetermined coercive force; first means connected to apply to said element a momentary magnetic field in one direction and of a magnitude in excess of both said critical magnetic field and said coercive force; second means connected to apply to said element a momentary magnetic field in a direction opposite said one direction and of a magnitude in excess of both said critical magnetic field and said coercive force; and third means connected to apply to said element a steady magnetic field which opposes the field in said one direction and reinforces the field in said opposite direction.

12. A superconductive storage device according to claim 11, wherein said first and second means are each connected to apply to said element a momentary magnetic field of a magnitude at least twice the magnitude of the critical magnetic field associated with said element.

13. A superconductive storage device comprising an elongated thin film ferromagnetic superconductive gate element having predetermined critical magnetic field and coercive force characteristics; an elongated thin film nonferromagnetic superconductive bias control element mounted adjacent to said gate element; an elongated thin film nonferromagnetic superconductive setting control element mounted adjacent to said gate element; first means connected to apply to said setting control element a current pulse of sufficient magnitude to create a first magnetizing field in excess of said predetermined characteristics, whereby to induce a remanent magnetization in one direction in said gate element; second means connected to apply to said bias control element a current pulse of sufficient magnitude to create a magnetic biasing field which opposes said remanent magnetization, said first and second means being mounted to effect a combination of said first magnetizing field and said magnetic biasing field such as to establish a superconductive state in said gate element; and third means connected to apply to said gate element a second magnetizing field substantially equal and opposite to said first magnetizing field, said third means being mounted to produce and direct a second magnetizing field such as to transform said gate element to the resistive state and to set up in said gate element a remanent magnetization in a direction opposite said one remanent magnetization direction.

14. A superconductive device comprising: a superconductive control member; a superconductive element to be controlled by said member and capable of retaining a remanent magnetization, and that, while free of remanent magnetization and during subjection to an environment at a temperature below the transition temperature of said element, is capable of exhibting superconductive electrical conduction characteristics, and upon subjection to an applied magnetic field of a magnitude sufficient to impart a remanent magnetization to said element, followed by the removal of said applied magnetic field, is capable of exhibiting resistive electrical conduction characteristics during subjection to said environment at said first named temperature; and said member being positioned in control adjacency with respect to said element.

15. The device of claim 14 wherein said element exhibits ferromagnetic properties at temperatures both below and above said transition temperature.

References Cited in the file of this patent

UNITED STATES PATENTS

| | | |
|---|---|---|
| 2,938,160 | Steele | May 24, 1960 |
| 2,946,030 | Slade | July 19, 1960 |
| 2,980,807 | Groetzinger et al. | Apr. 18, 1961 |